United States Patent
Donkers et al.

(10) Patent No.: US 9,385,226 B2
(45) Date of Patent: Jul. 5, 2016

(54) SEMICONDUCTOR HETEROJUNCTION DEVICE

(71) Applicant: NXP B.V., Eindhoven (NL)

(72) Inventors: Johannes Josephus Theodorus Marinus Donkers, Eindhoven (NL); Godefridus Adrianus Maria Hurkx, Eindhoven (NL); Stephan Bastiaan Simon Heil, Eindhoven (NL); Michael Antoine Armand in 't Zandt, Veldhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/613,182

(22) Filed: Feb. 3, 2015

(65) Prior Publication Data

US 2015/0228774 A1   Aug. 13, 2015

(30) Foreign Application Priority Data

Feb. 12, 2014 (EP) .................................... 14154903

(51) Int. Cl.

| | | |
|---|---|---|
| H01L 29/15 | (2006.01) |
| H01L 29/778 | (2006.01) |
| H01L 29/20 | (2006.01) |
| H01L 29/201 | (2006.01) |
| H01L 29/205 | (2006.01) |
| H01L 23/31 | (2006.01) |
| H01L 29/872 | (2006.01) |
| H01L 29/267 | (2006.01) |
| H01L 29/40 | (2006.01) |

(52) U.S. Cl.
CPC ........ *H01L 29/7787* (2013.01); *H01L 23/3171* (2013.01); *H01L 29/201* (2013.01);
(Continued)

(58) Field of Classification Search
CPC .................... H01L 29/66462; H01L 29/7787; H01L 2924/00; H01L 2924/0002; H01L 29/7783; H01L 29/42316; H01L 29/778; H01L 23/3171; H01L 29/66431; H01L 29/7786; H01L 23/291; H01L 21/26553; H01L 29/812

USPC ........................................................... 257/76
See application file for complete search history.

(56) References Cited

U.S. PATENT DOCUMENTS 4,176,372 A * 11/1979 Matsushita ........... H01L 21/314
                                                257/372
7,288,803 B2 * 10/2007 Beach ................. H01L 29/0692
                                                257/192

(Continued)

FOREIGN PATENT DOCUMENTS

| EP | 0 217 326 A2 | 4/1987 |
| JP | 2007 048866 A | 2/2007 |

OTHER PUBLICATIONS

Donkers et al. 600V-900V GaN-on-Si Process Technology for Schottky Barrier Diodes and Power Switches Fabricated in a Standard Si-Production Fab, CS Mantech Conf., pp. 259-262 (5-2013).

(Continued)

*Primary Examiner* — Tod T Van Roy
*Assistant Examiner* — Vu A Vu (57) ABSTRACT

A heterojunction semiconductor device (200) comprising a substrate (202) and a multilayer structure disposed on the substrate. The multilayer structure comprising a first layer (204), which comprises a first semiconductor disposed on top of the substrate, and a second layer (206), which comprises a second semiconductor disposed on top of the first layer to define an interface between the first layer and the second layer. The second semiconductor is different from the first semiconductor such that a Two-Dimensional Electron Gas (220) forms adjacent to the interface. The multilayer structure also comprising a passivation layer, which comprises a semiconductor passivation layer (208) disposed on top of the second layer. The heterojunction semiconductor device also includes a first terminal (210) electrically coupled to a first area of the heterojunction semiconductor device; and a second terminal (212) electrically coupled to a second area of the heterojunction semiconductor device. The second terminal (212) is electrically coupled to the semiconductor passivation layer such that electric charge can flow into the second terminal (212) from the semiconductor passivation layer (208).

18 Claims, 3 Drawing Sheets

(52) U.S. Cl.
CPC .......... *H01L29/2003* (2013.01); *H01L 29/205* (2013.01); *H01L 29/267* (2013.01); *H01L 29/405* (2013.01); *H01L 29/872* (2013.01); *H01L 2924/0002* (2013.01)

(56) References Cited

U.S. PATENT DOCUMENTS 8,338,861 B2 * 12/2012 Briere ............... H01L 21/28264
257/194

| | | |
|---|---|---|
| 2012/0187451 A1 | 7/2012 | Saito |
| 2014/0167064 A1 | 6/2014 | Hurkx et al. |
| 2014/0306232 A1 | 10/2014 | Donkers et al. |

OTHER PUBLICATIONS

Van Dalen et al. "Breaking the Silicon Limit Using Semi-Insulating Resurf Layers," Proceedings of 2001 Int. Sym. on Power Semiconductor Devices & ICs, pp. 391-394 (2001).

Extended European Search Report for EP Patent Appln. No. 14154903.0 (Jul. 2, 2014).

* cited by examiner

SEMICONDUCTOR HETEROJUNCTION DEVICE

CROSS-REFERENCE TO RELATED APPLICATIONS

This application claims the priority under 35 U.S.C. §119 of European patent application no. 14154903.0, filed on Feb. 12, 2014, the contents of which are incorporated by reference herein.

This disclosure relates to semiconductor heterojunction devices such as high electron mobility transistors (HEMTs) and Schottky diodes, and relates to the use of a semiconductor passivation layer in such devices.

A first aspect of the invention provides a semiconductor heterojunction device comprising: a substrate; a multilayer structure disposed on the substrate, the multilayer structure comprising a first layer comprising a first semiconductor disposed on top of the substrate; a second layer comprising a second semiconductor disposed on top of the first layer to define an interface between the first layer and the second layer, wherein the second semiconductor is different from the first semiconductor such that a Two-Dimensional Electron Gas forms adjacent to the interface; a passivation layer comprising a semiconductor passivation layer disposed on top of the second layer; a first terminal electrically coupled to a first area of the heterojunction semiconductor device; and a second terminal electrically coupled to a second area of the heterojunction semiconductor device, wherein the second terminal is electrically coupled to the semiconductor passivation layer such that electric charge can flow into the second terminal from the semiconductor passivation layer.

The first semiconductor may be a first III-V semiconductor. The second semiconductor may be a second III-V semiconductor.

The III-V semiconductors may comprise any metallic elements selected from group III of the periodic table together with any of the non-metallic elements selected from group V of the periodic table.

The III-V semiconductors may comprise one or more of the metallic elements aluminium, gallium and indium. The III-V semiconductors may comprise nitride semiconductors, or phosphide semiconductors, or arsenide semiconductors.

The III-V semiconductors may comprise any of the semiconductors Gallium Nitride, Aluminium Nitride, Indium Nitride, Aluminium Gallium Nitride, Aluminium Indium Nitride, Gallium Indium Nitride, Aluminium Gallium Indium Nitride, Gallium Phosphide, Aluminium Phosphide, Indium Phosphide, Aluminium Gallium Phosphide, Aluminium Indium Phosphide, Gallium Indium Phosphide, Aluminium Gallium Indium Phosphide, Gallium Arsenide, Aluminium Arsenide, Indium Arsenide, Aluminium Gallium Arsenide, Aluminium Indium Arsenide, Gallium Indium Arsenide, and Aluminium Gallium Indium Arsenide.

The first layer may be a p-type semiconductor doped with a first concentration of p-type dopants. The second layer may be an n-type semiconductor, or the second layer may be an undoped semiconductor, or the second layer may be a p-type semiconductor doped with a second concentration of p-type dopants where the second concentration is less than the first concentration.

The semiconductor passivation layer may comprise Semi Insulating Polycrystalline Silicon.

The passivation layer may further comprise a dielectric layer disposed between the semiconductor passivation layer and the second layer.

The passivation layer comprises a semiconductor passivation layer in direct contact with the second layer. The first layer may comprise Gallium Nitride. The second layer may comprise Aluminium Gallium Nitride.

The semiconductor passivation layer may have a sheet resistance of at least $\rho_{square\ lower\ limit}$, wherein:

$$\rho_{square\ lower\ limit} > \frac{V_{stress}W_{finger}}{L_{drift}I_{leak}};$$

where $V_{stress}$ is a bias voltage applied to the first terminal; $W_{finger}$ is the width of the first terminal in a first direction; $L_{drift}$ is the physical distance between the first terminal and second terminal in a second direction, wherein the second direction is perpendicular to the first direction; and $I_{leak}$ is the electrical current leakage between the first terminal and the second terminal through any electrical pathway in the device excluding the semiconductor passivation layer.

The semiconductor passivation layer may have a sheet resistance no greater than $\rho_{square\ upper\ limit}$, wherein:

$$\rho_{square\ upper\ limit} < \frac{\tau V_{stress}}{qn_{inj}L_{drift}^2};$$

where $\tau$ is the time constant for the build-up of charges injected into the semiconductor passivation layer from the second layer; $V_{stress}$ is a reverse bias voltage applied to the first terminal; q is the electron charge; $n_{inj}$ is the number density of electrons in the Two-Dimensional Electron Gas; and $L_{drift}$ is the physical distance between the first terminal and second terminal.

The semiconductor passivation layer may have a sheet resistance of between $10^9$ Ohms and $10^{15}$ Ohms.

The electrical coupling of the first terminal to the heterojunction device may comprise a Schottky contact with the second layer. The electrical coupling of the second terminal to the heterojunction device may comprise an Ohmic contact with the second layer. The device may comprise a Schottky diode.

The heterojunction semiconductor device may further comprise a third terminal electrically coupled to a third area of the heterojunction device such that the first terminal is positioned between the second terminal and the third terminal.

The third terminal may comprise a source electrode. The second terminal may comprise a drain electrode. The first terminal may comprise a gate electrode. The heterojunction semiconductor device may comprise a High Electron Mobility Transistor.

The heterojunction semiconductor device may further comprise a dielectric layer disposed between the second layer and the semiconductor passivation layer. The third terminal may comprise a source electrode electrically coupled to the second layer such that electric charge can flow from the third terminal to the second layer. The second terminal may comprise a drain electrode electrically coupled the second layer such that electric charge can flow from the second layer into the second terminal. The first terminal may comprise a gate electrode disposed on top of the dielectric layer. The heterojunction semiconductor device may comprise a Metal-Insulator-Semiconductor High Electron Mobility Transistor.

There may be provided an integrated circuit comprising any heterojunction semiconductor device disclosed herein.

Examples of the invention will now be described in detail with reference to the accompanying figures, in which.

Semiconductor heterojunction devices may comprise a first layer of semiconductor material disposed on a substrate and a second layer of a different semiconductor material disposed on the first layer. The interface between the two layers is the heterojunction. With the appropriate selection of the two different semiconductor materials, the difference between the two semiconductors will result in the formation of a two-dimensional electron gas (2DEG) to the interface. Suitable semiconductor materials include the group III-V semiconductors, which comprise at least one metal element selected from group III of the periodic table, such as aluminium, gallium and indium, together with a non-metallic element selected from group V of the periodic table, such as nitrogen, phosphorus or arsenic. One of the layers may be doped to form a p-type semiconductor. The second layer may be doped to form an n-type semiconductor, or may be undoped, or may be doped to form a p-type semiconductor provided the concentration of p-type dopant is lower than the concentration of p-type dopant in the first layer.

For high power and high temperature applications, devices comprising a first layer of GaN and a second layer of AlGaN can be particularly desirable. GaN/AlGaN devices are good candidates for high-efficiency power converters requiring fast switching, low conduction losses and the ability to operate at voltages up to 1 kV.

The 2DEG within the heterojunction device enables a high electrical current to flow through the device with low electrical resistance. A problem addressed by the present disclosure is how to design heterojunction devices with lower electrical resistances, and in particular lower dynamic-on resistances, than previously known heterojunction devices. Heterojunction devices can be configured to form transistors by including a source terminal, a drain terminal and a gate terminal disposed between the source terminal and the drain terminal. Alternatively, such devices can be configured to form a Schottky diode by including only two electrical terminals: an anode and a cathode.

Generally, semiconductor heterojunction devices will include a passivation layer disposed on top of the second layer of semiconductor material. The passivation layer can comprise an inert insulating material such as silicon nitride (SiN) or silicon oxide (SiO$_2$).

Figure 1:
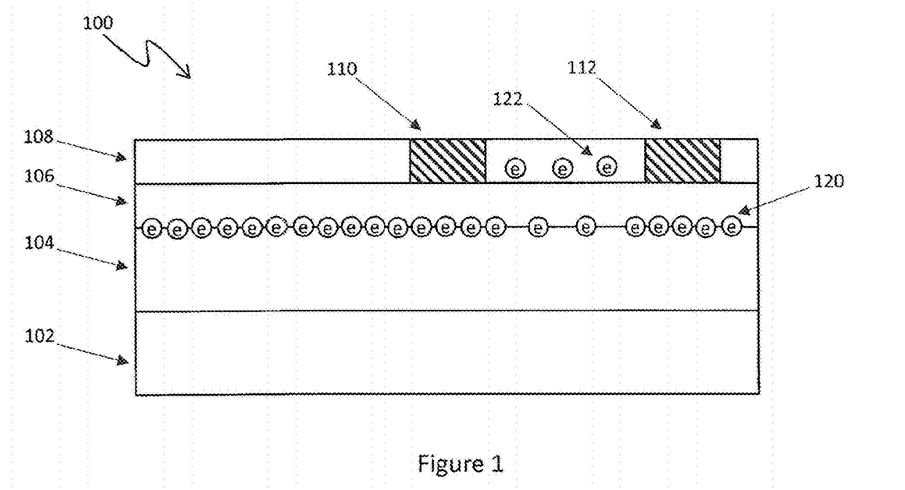
FIG. 1 shows a cross-section view of a Schottky diode with a dielectric passivation layer.

FIG. 1 shows a Schottky diode 100 which comprises a substrate 102, a first semiconductor layer 104 disposed on top of the substrate 102, a second semiconductor layer 106 disposed on top of the first semiconductor layer 104 and a dielectric passivation layer 108 disposed on top of the second semiconductor layer 106. Given an appropriate choice of materials for the first semiconductor layer 104 and the second semiconductor layer 106, a two-dimensional electron gas 120 (2DEG) will form near the interface between the first semiconductor layer 104 and the second semiconductor layer 106. The substrate 102 may comprise silicon, the first layer 104 may comprise a first semiconductor such as p-type GaN, the second layer 106 may comprise a second semiconductor such as AlGaN and the passivation layer 108 may comprise SiO$_2$ or SiN. It will be appreciated by persons skilled in the art that additional layers may be present (not shown), such as a multilayer structure disposed between the substrate 102 and the first semiconductor layer 104 in order to accommodate any mismatch between the lattice constants of the substrate 102 and the first semiconductor layer 104.

The Schottky diode 100 further comprises a first electrical terminal 110, which is an anode, and a second electrical terminal 112, which is a cathode. The anode 110 is electrically coupled to the second semiconductor layer 106. The cathode 112 is electrically coupled to the second semiconductor layer 106. Electrical current can flow into the diode 100 through the anode 110 and out of the diode 100 through the cathode 112. Within the diode 100, electrical current flows from the anode 110 to the cathode 112 via the 2DEG 120. During the off-state part of the switching cycle of the diode 100, hot electrons are injected into the passivation layer 108 where they become trapped electrons 122. These trapped electrons 122 remain in the passivation layer 108 for a relatively long period of time as they cannot flow through the passivation layer 108 to the cathode 112 because of the very low electrical conductivity of the dielectric passivation layer 112.

The presence of trapped electrons 122 in the passivation layer 108 can be undesirable because, being in close proximity to the 2DEG 120, the trapped electrons reduce the density of electrons in the 2DEG 120. This reduction in the density of the 2DEG 120 increases the resistance of the diode 100, which consequently reduces the electrical performance of the diode 100. This phenomenon may be referred to as current collapse, or dynamic Ron effect or drain lag or gate lag depending of the nature of the terminal to which a voltage is applied.

It will be appreciated by persons skilled in the art that in Schottky diodes the electrical terminals are electrically coupled to the heterojunction so as to allow electrical charge to flow into the heterojunction through the anode and out of the heterojunction through the cathode. The electrical coupling of the anode will comprise a Schottky contact. The electrical coupling of the cathode may comprise an Ohmic contact.

Figure 2:
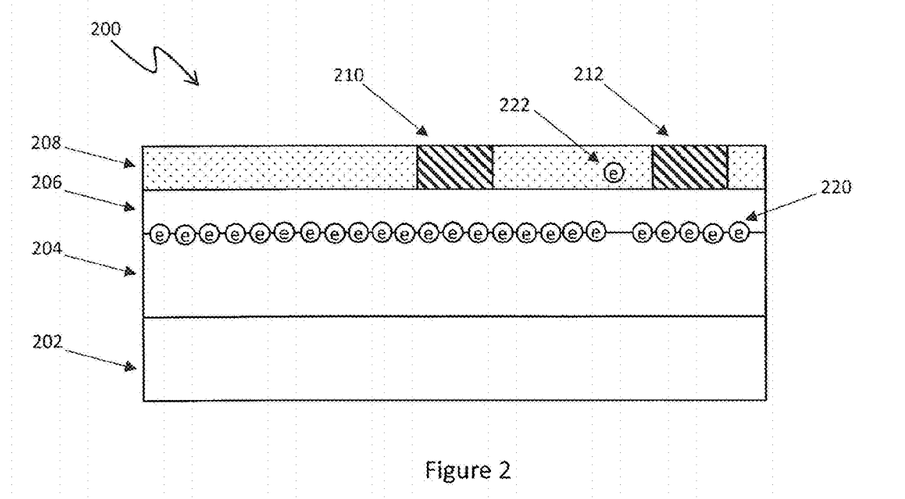
FIG. 2 shows a cross-section view of a Schottky diode with a SIPOS passivation layer.

FIG. 2 shows a Schottky diode 200 with a passivation layer 208 comprising a semiconductor passivation layer. Features in FIG. 2 that are similar to features in FIG. 1 have been given corresponding reference numerals and will not necessarily be described here to assist in the clarity of the disclosure.

In some examples, an advantageous choice of semiconductor material for the semiconductor passivation layer may comprise Semi-Insulating Polycrystalline Silicon (SIPOS). In the following disclosure the semiconductor passivation layer may be referred to as the semiconductor Semi-Insulating Polycrystalline Silicon passivation layer, however it will be appreciated that many different semiconductor materials could advantageously be used instead of SIPOS.

SIPOS, also referred to as Polydox (Poly-Silicon Doped with Oxide), can be deposited as a film consisting of silicon phases, various silicon oxides and some incorporated hydrogen. When annealed at a temperature above 900° C. SIPOS films consist of a phase mixture of polycrystalline silicon and silicon oxides. An annealed SIPOS film behaves electrically as a semiconductor.

The passivation layer 208 is electrically coupled to the anode 210 and the cathode 212. The resistance between the passivation layer 208 and the anode 210 and the cathode 212 can be such that a significant portion of the voltage drop between the anode 210 and the cathode 212 falls across the passivation layer 208 in the drift region. Here, a significant portion may be close to 100%, such as at least 80%, 90% or 95% or it may be a smaller percentage such as 10%. This voltage drop enables hot electrons 222 injected into the passivation layer 208 to flow through the semiconducting SIPOS passivation layer 208 to the cathode 212 where they flow out of the device. In this way they do not become trapped. By using a semiconducting passivation layer, the build-up of trapped electrons can be reduced or avoided. This allows the 2DEG 220 to maintain a higher density of electrons than is possible with an insulating passivation layer. Consequently, a diode 200 with a SIPOS passivation layer 208 will maintain a lower electrical resistance including a lower dynamic-on resistance, and will therefore provide better performance than a similar diode with only an insulating passivation layer.

Since the SIPOS passivation layer 208 is electrically coupled to both the anode 210 and the cathode 212, there will be some leakage of current from the anode 210 through the SIPOS passivation layer 208 to the cathode 212. In the absence of a semiconducting passivation layer, a heterojunction device will still experience some inherent current leakage $I_{leak}$. The leakage current $I_{leak}$ may be determined by measuring the current that flows when a positive voltage, for example 400V, is applied to the cathode while the anode is held at 0V. This inherent current leakage may occur through any electrical pathway that connects the anode 210 to the cathode 212, except for pathways through a semiconducting passivation layer. It may be beneficial to ensure that the current leakage through the SIPOS passivation layer 208 does not exceed the inherent current leakage $I_{leak}$. This characteristic can therefore be used to determine a lower limit on the electrical sheet resistance $\rho_{square\ lower\ limit}$ of the SIPOS passivation layer 208:

$$\rho_{square\ lower\ limit} > \frac{V_{stress} W_{finger}}{L_{drift} I_{leak}}$$

Here, $V_{stress}$ is the reverse blocking voltage that is the voltage applied to the cathode in order to measure the leakage current $L_{drift}$ is the physical distance between the anode 210 and the cathode 212, and $W_{finger}$ is the width of the anode 210 and cathode 212. In FIG. 2, the dimension $W_{finger}$ extends into and out of the page, and the dimension $L_{drift}$ extends horizontally across the page. Consequently, the product of $L_{drift}$ and $W_{finger}$ is the area of the SIPOS passivation layer 208 between the anode 210 and the cathode 212.

The value for the sheet resistance $\rho_{square}$ of the SIPOS layer can also be subject to an upper limit: the SIPOS passivation layer 208 may be particularly effective in preventing the build-up of charge if it is capable of conducting the charge to the cathode at least as rapidly as charge is injected into the passivation layer 208. The build-up of the injected charge has a time constant $\tau$. The charge density sufficient to disrupt the 2DEG is approximately equal to the charge density of the 2DEG itself. This charge density can be expressed as the product of the electron charge q with the number density, per unit area, of charges $n_{inj}$ in the 2DEG. Therefore, the current through the SIPOS layer, $I_{SIPOS}$, can be set such that it exceeds the following threshold in order to advantageously be especially effective at removing the injected charge:

$$I_{SIPOS} > \frac{q n_{inj} L_{drift} W_{finger}}{\tau}$$

The time constant $\tau$ can be determined by measuring the time dependence of the on-resistance immediately after applying the stress voltage. So for example, by ramping up the drain voltage to e.g. 400 V and measuring the drain resistance versus time.

Consequently, the sheet resistance $\rho_{square}$ of the SIPOS layer can be selected such that it does not exceed a value $\rho_{square\ upper\ limit}$ given by the following formula:

$$\rho_{square\ upper\ limit} < \frac{\tau V_{stress}}{q n_{inj} L_{drift}^2}$$

For example, if $I_{leak}=10^{-8}$ A/mm, $V_{stress}=1000$V, $n_{inj}=5\times 10^{12}$ cm$^{-2}$, $L_{drift}=10$ µm, $W_{finger}=1$ mm and $\tau=1$ s, then an advantageous range of sheet resistance values is:

$$10^9 \Omega < \rho_{square} < 10^{15} \Omega$$

Equivalently, for a SIPOS layer 100 nm thick, the corresponding range of specific resistances is:

$$10^4\ \Omega cm < \rho < 10^{10}\ \Omega cm$$

Of course, it will be appreciated that the values used to calculate the range of acceptable resistances will vary from device to device. In particular, the value of the time constant $\tau$ can vary considerably, which in turn leads to wide variations in the upper limit for the sheet resistance.

It will be appreciated by persons skilled in the art that further passivation layers (not shown) may be deposited on top of the SIPOS passivation layer 208.

Figure 3:
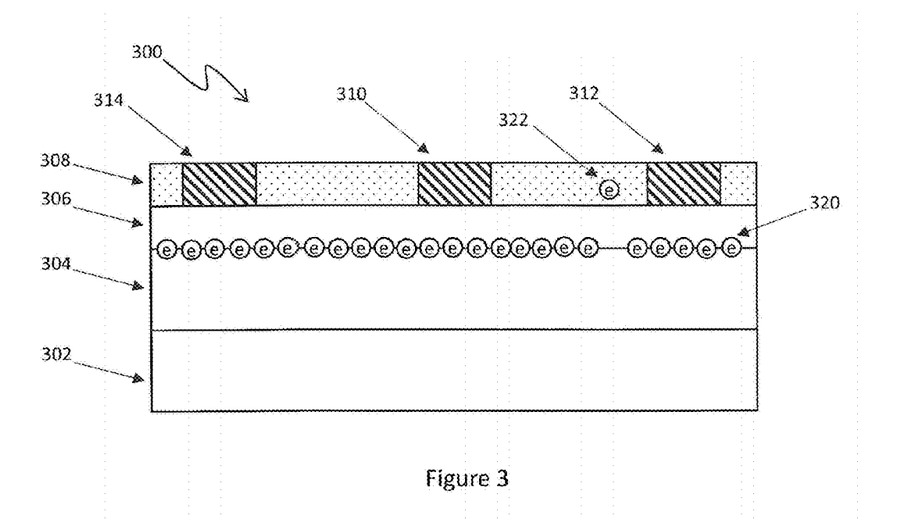
FIG. 3 shows a cross-section view of a High Electron Mobility Transistor (HEMT) with a SIPOS passivation layer.

FIG. 3 shows a High Electron Mobility Transistor (HEMT) 300 with a SIPOS passivation layer 308. Features in FIG. 3 that are similar to features in FIGS. 1 and 2 have been given corresponding reference numerals and will not necessarily be described again here. The HEMT 300 has a first electrical terminal 310, a second electrical terminal 312 and a third electrical terminal 314. The first terminal 310 is located between the second terminal 312 and the third terminal 314 and is thereby configured to act as a gate electrode for the HEMT 300. The second terminal 312 is configured to act as the drain electrode, while the third terminal 314 is configured to act as the source electrode for the HEMT 300. The source electrode 314, the drain electrode 312, and the gate electrode 310, are electrically coupled to the second layer 306. This electrical coupling allows current to flow from the source electrode 314 to the drain electrode 312 through the 2DEG 320. Application of a blocking voltage to the gate electrode 310 disrupts the 2DEG 320 and thereby switches the HEMT 300 into an 'off', or non-conducting, state.

It will be appreciated by persons skilled in the art that in HEMTs the second terminal and the third terminal are electrically coupled to the heterojunction so as to allow electrical charge to flow into the heterojunction through the source electrode and out of the heterojunction through the drain electrode. The electrical coupling of the source electrode and the drain electrode to the heterojunction is typically achieved by an Ohmic contact.

As in the diode discussed above in relation to FIG. 2, the HEMT 300 will experience hot electrons being injected into the passivation layer 308. Since the passivation layer 308 comprises SIPOS, those injected electrons 322 will be conducted through the passivation layer 308 to the drain electrode 312 where they are removed from the device. In the same way as discussed above, the resistances between the passivation layer 308 and the terminals should be such that a significant portion of the voltage drop between the drain electrode 312 and the gate electrode 310 falls across the passivation layer 308 in the drift region. Preventing the build-up of trapped electrons in the passivation layer 308 in this way allows the 2DEG 320 to maintain its electron density and thereby provide a lower electrical resistance when the HEMT 300 is in it conducting, or 'on', state. This provides the advantage of enabling more efficient operation of the HEMT 300.

As in the diode discussed above in relation to FIG. 2, it can be advantageous to provide a SIPOS passivation layer 308 that has sufficient conductivity to enable removal of injected electrons 322 while ensuring that the conductivity is not high enough to cause a significant leakage of charge from the first electrical terminal 310, the gate electrode, to the second electrical terminal 312, the drain electrode, when a voltage is applied to the gate electrode. The formulae disclosed above in relation to FIG. 2 are equally valid in relation to the HEMT 300, in which $V_{stress}$ is the voltage that is applied to the drain electrode 312. The leakage current $I_{leak}$ may be determined by measuring the current that flows when a positive voltage, for example 400V, is applied to the drain electrode while maintaining the source electrode 314 at 0V, after the HEMT device 300 has been switched to the off state by switching the gate voltage to for example −7 V. $L_{drift}$ is the distance between the gate electrode 310 and the drain electrode 312, and $W_{finger}$ is W the width of the gate electrode 310 and the drain electrode 312. These formulae allow the calculation of an appropriate resistivity of the SIPOS passivation layer 308 for the HEMT 300.

Figure 4:
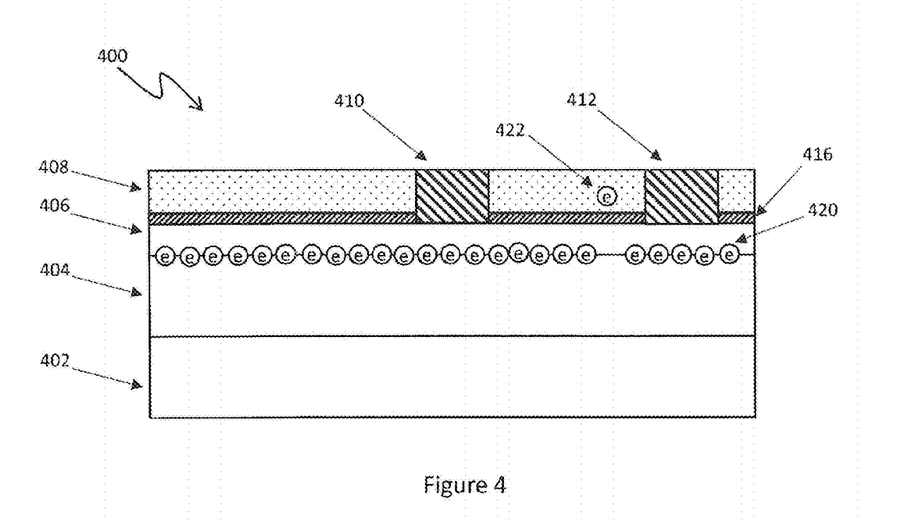
FIG. 4 shows a cross-section view of a Schottky diode with a passivation layer comprising a SIPOS layer on top of a dielectric layer.

FIG. 4 shows a Schottky diode 400 with a SIPOS passivation layer 408. Features in FIG. 4 that are similar to features in FIGS. 1 and 2 have been given corresponding reference numerals and will not necessarily be described here again. The Schottky diode 400 comprises a dielectric passivation layer 416 disposed between the SIPOS passivation layer 408 and the second layer 406. The dielectric passivation layer 416 may comprise SiN or $SiO_2$ or any other suitable insulating material. If the dielectric passivation layer 416 is sufficiently thin, for example of the order of about 1-10 nm, then hot electrons will be injected through the dielectric passivation layer 416 into the SIPOS passivation layer 408 and may not become trapped in the dielectric passivation layer 416. Once an injected electron 422 is inside the SIPOS passivation layer 408 it will be conducted to the cathode 412 where it will be removed from the device as discussed above.

The formulae disclosed above in relation to FIG. 2 are equally valid in relation to the Schottky diode 400 of FIG. 4. These formulae allow the calculation of a suitable resistivity of the SIPOS passivation layer 408 required for the Schottky diode 400. The inclusion of a SIPOS passivation layer 408 with appropriate resistivity in the Schottky diode 400 allows the device to maintain a lower electrical resistance and therefore to provide superior electrical performance.

Figure 5:
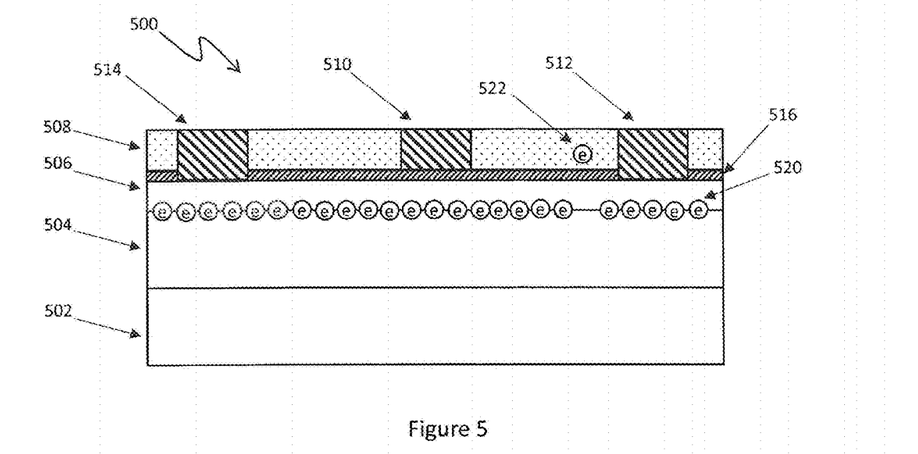
FIG. 5 shows a cross-section view of a Metal-Insulator-Semiconductor High Electron Mobility Transistor (MISHEMT) with a SIPOS passivation layer on top of a dielectric passivation layer.

FIG. 5 shows a Metal Insulator Semiconductor High Electron Mobility Transistor (MISHEMT) 500 with a SIPOS passivation layer 508. Features in FIG. 5 that are similar to features in the preceding figures have been given corresponding reference numerals and will not necessarily be described here again. The MISHEMT 500 has a dielectric passivation layer 516 disposed between the SIPOS passivation layer 508 and the second layer 506. The dielectric passivation layer 516 may comprise SiN or $SiO_2$ or any other suitable insulating material.

The MISHEMT 500 has a first electrical terminal 510, configured to act as a gate electrode, disposed on top of the dielectric passivation layer 516. The MISHEMT 500 has a second electrical terminal 512, configured to act as a drain electrode, electrically coupled to the second layer 506. The MISHEMT 500 has a third electrical terminal 514, configured to act as a source electrode, electrically coupled to the second layer 506. It will be appreciated by persons skilled in the art that the source electrode and the drain electrode can be electrically coupled to the heterojunction in such a way that electric charge can flow into the heterojunction from the source electrode and electric charge can flow out of the heterojunction via the drain electrode. The electrical coupling of the source electrode to the second layer typically comprises an Ohmic contact. The electrical coupling of the drain electrode to the second layer typically comprises an Ohmic contact.

If the dielectric passivation layer 516 is sufficiently thin, in some examples less than about 10 nm, then hot electrons will be injected through the dielectric passivation layer 516 into the SIPOS passivation layer 508 and may not become trapped in the dielectric passivation layer 516. Once an injected electron 522 is inside the SIPOS passivation layer 508 it can be conducted to the drain electrode 512 where it will be removed from the device. That is, a thin dielectric layer 516 may be located between the gate 510 and the SIPOS passivation layer 508 because the GaN region below this dielectric layer 516 can form the current path between the gate 510 and the SIPOS passivation layer 508.

The formulae disclosed above in relation to FIG. 2 are equally valid in relation to the MISHEMT 500. These formulae allow the calculation of an appropriate resistivity for the SIPOS passivation layer 508 required for the MISHEMT 500. The inclusion of a SIPOS passivation layer 508 with appropriate resistivity in the MISHEMT 500 allows the device to maintain a lower electrical resistance and therefore to provide superior electrical performance.

It will be appreciated that it is also possible to fabricate a device (not illustrated) similar to the MISHEMT 500 of FIG. 5, but in which the gate electrode is provided as a Schottky contact to electrically couple to the second semiconductor layer. Such a device would be a regular HEMT, with a dielectric passivation layer and a SIPOS passivation layer. Provided that the dielectric passivation layer was of a suitably small thickness as discussed above in relation to FIGS. 4 and 5, the device would derive the same advantages from the SIPOS passivation layer as disclosed above in relation to the devices shown in FIGS. 4 and 5.

Persons skilled in the art will be aware of standard techniques that can be employed to manufacture the semiconductor heterojunction devices disclosed herein. A dielectric passivation layer, if present, may be formed on the heterojunction device by depositing, for example, SiN by Plasma Enhanced Chemical Vapour Deposition (PECVD) or Low Pressure Chemical Vapour Deposition (LPCVD). The SIPOS passivation layer may be formed using a LPCVD process. The SIPOS passivation layer may be 50 nm to 100 nm thick. After deposition, the SIPOS passivation layer may be selectively etched to provide a suitable profile for coupling the electrical terminals to the heterojunction device.

Figure 6:
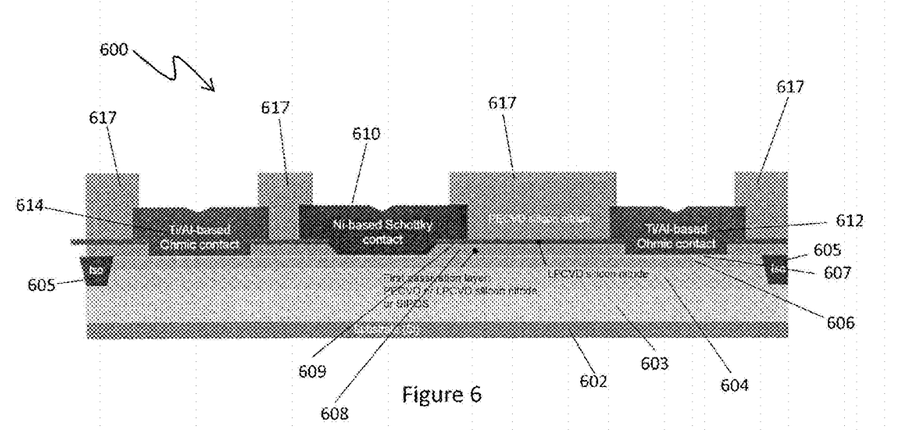
FIG. 6 shows a cross-section view of a Gallium Nitride Aluminium Gallium Nitride HEMT with a SIPOS passivation layer.

FIG. 6 shows a particular example of a HEMT 600, in cross-section, before back-end metallization has been performed. The substrate 602 comprises silicon. A multilayer structure 603 is deposited on the silicon to accommodate the mismatch between the lattice constant of the silicon substrate 602 and the first semiconductor layer 604 that is deposited on top of the multilayer structure 603. The first semiconductor layer 604 comprises GaN. Electrical isolation 605 is provided at the edges of the device. The second semiconductor layer 606, comprising AlGaN, is deposited on top of the first semiconductor layer 604. In this example, a third semiconductor layer 607, comprising a very thin layer of GaN, is formed on top of the second semiconductor layer 606.

A SIPOS passivation layer 608 is formed, by either PECVD or LPCVD, on top of the third semiconductor layer 607. The SIPOS layer can then be selectively dry etched with a $CF_4/O_2$ chemistry to ensure the indicated sloped profile. The exact slope has proven to affect the reverse leakage current in the case of silicon nitride passivation: the lower the angle of the slope with the GaN interface, the lower the leakage current, due to the effect the Schottky metal has as a field plate on the 2DEG. After patterning of the SIPOS layer, LPCVD can be optionally be used to provide a thin passivation layer 609 of silicon nitride on top of the SIPOS passivation layer 608, near the edges of the Schottky diode.

A Nickel based Schottky contact is provided to comprise the gate electrode 610. Titanium Aluminium (Ti/Al) based ohmic contacts are provided to comprise the drain electrode 612 and the source electrode 614. Further passivation layers 617 comprising SiN can then be added by PECVD. Persons skilled in the art will appreciate that final back-end metallization (not shown) can then be applied in the usual way to complete the device.

Due to recent advances in GaN-on-Si epitaxy, type III-V semiconductor devices, such as the HEMT 600 of FIG. 6, can be produced in low-cost high-volume main-stream Si production facilities. It is expected that GaN devices incorporating a SIPOS passivation layer will prove successful across a broad range of applications, including in integrated circuits and in power-handling, radio-frequency and sensor applications.

Examples disclosed herein can relate to any power device where electron injection into the passivation affects the drift resistance. This includes devices where a 2DEG defines the drift resistance. Such devices that include a 2DEG may include a heterojunction.

The invention claimed is:

1. A heterojunction semiconductor device comprising:
 a substrate;
 a multilayer structure disposed on the substrate, the multilayer structure comprising:
  a first layer comprising a first semiconductor disposed on top of the substrate;
  a second layer comprising a second semiconductor disposed on top of the first layer to define an interface between the first layer and the second layer, wherein the second semiconductor is different from the first semiconductor such that a Two-Dimensional Electron Gas forms adjacent to the interface;
 a passivation layer comprising a semiconductor passivation layer disposed on top of the second layer;
 a first terminal electrically coupled to a first area of the heterojunction semiconductor device;
 a second terminal electrically coupled to a second area of the heterojunction semiconductor device, wherein the second terminal is electrically coupled to the semiconductor passivation layer such that electric charge can flow into the second terminal from the semiconductor passivation layer; and
 wherein the passivation layer is configured and arranged to transfer sufficient leakage current, from the first terminal to the second terminal, sufficient to remove charge injected into the passivation layer from the Two-Dimensional Electron Gas.

2. The heterojunction semiconductor device of claim 1, wherein the first semiconductor is a first III-V semiconductor, and the second semiconductor is a second III-V semiconductor.

3. The heterojunction semiconductor device of claim 1, wherein the semiconductor passivation layer comprises Semi Insulating Polycrystalline Silicon.

4. The heterojunction semiconductor device of claim 1, wherein the passivation layer further comprises a dielectric layer disposed between the semiconductor passivation layer and the second layer.

5. The heterojunction semiconductor device of claim 1, wherein the passivation layer comprises a semiconductor passivation layer in direct contact with the second layer.

6. The heterojunction semiconductor device of claim 1, wherein the first layer comprises Gallium Nitride.

7. The heterojunction semiconductor device of claim 1, wherein the second layer comprises Aluminum Gallium Nitride.

8. The heterojunction semiconductor device of claim 1, wherein the semiconductor passivation layer has a sheet resistance of at least $\rho_{square\ lower\ limit}$, wherein:

$$\rho_{square\ lower\ limit} > \frac{V_{stress} W_{finger}}{L_{drift} I_{leak}};$$

where $V_{stress}$ is a bias voltage applied to the first terminal; $W_{finger}$ is the width of the first terminal in a first direction; $L_{drift}$ is the physical distance between the first terminal and second terminal in a second direction, wherein the second direction is perpendicular to the first direction; and $I_{leak}$ is the electrical current leakage between the first terminal and the second terminal through any electrical pathway in the device excluding the semiconductor passivation layer.

9. The heterojunction semiconductor device of claim 1, wherein the semiconductor passivation layer has a sheet resistance no greater than $\rho_{square\ upper\ limit}$, wherein:

$$\rho_{square\ upper\ limit} < \frac{\tau V_{stress}}{q n_{inj} L_{drift}^2};$$

where $\tau$ is the time constant for the build-up of charges injected into the semiconductor passivation layer from the second layer;
$V_{stress}$ is a reverse bias voltage applied to the first terminal;
q is the electron charge;
$n_{inj}$ is the number density of electrons in the Two-Dimensional Electron Gas; and
$L_{drift}$ is the physical distance between the first terminal and second terminal.

10. The heterojunction semiconductor device of claim 1, wherein the semiconductor passivation layer has a sheet resistance of between $10^9$ Ohms and $10^{15}$ Ohms.

11. The heterojunction semiconductor device of claim 1, wherein the electrical coupling of the first terminal to the heterojunction device comprises a Schottky contact with the second layer and the electrical coupling of the second terminal to the heterojunction device comprises an Ohmic contact with the second layer, such that the device is configured to comprise a Schottky diode.

12. The heterojunction semiconductor device of claim 1, further comprising a third terminal electrically coupled to a third area of the heterojunction device such that the first terminal is positioned between the second terminal and the third terminal.

13. The heterojunction semiconductor device of claim 12, wherein:
the third terminal comprises a source electrode;
the second terminal comprises a drain electrode;
the first terminal comprises a gate electrode; and
whereby the heterojunction semiconductor device is configured to comprise a High Electron Mobility Transistor.

14. The heterojunction semiconductor device of claim 12, further comprising a dielectric layer disposed between the second layer and the semiconductor passivation layer, wherein:
the third terminal comprises a source electrode electrically coupled to the second layer such that electric charge can flow from the third terminal to the second layer;
the second terminal comprises a drain electrode electrically coupled the second layer such that electric charge can flow from the second layer into the second terminal;
the first terminal comprises a gate electrode disposed on top of the dielectric layer; and
whereby the heterojunction semiconductor device is configured to comprise a Metal-Insulator-Semiconductor High Electron Mobility Transistor.

15. An integrated circuit comprising the heterojunction semiconductor device of claim 1.

16. The heterojunction semiconductor device of claim 3, wherein the passivation layer further comprises a dielectric layer disposed between the semiconductor passivation layer and the second layer.

17. A heterojunction semiconductor device comprising:
a substrate;
a multilayer structure disposed on the substrate, the multilayer structure comprising:
a first layer comprising a first semiconductor disposed on top of the substrate;
a second layer comprising a second semiconductor disposed on top of the first layer to define an interface between the first layer and the second layer, wherein the second semiconductor is different from the first semiconductor such that a Two-Dimensional Electron Gas forms adjacent to the interface;
a passivation layer comprising a semiconductor passivation layer disposed on top of the second layer;
a first terminal electrically coupled to a first area of the heterojunction semiconductor device; and
a second terminal electrically coupled to a second area of the heterojunction semiconductor device, wherein the second terminal is electrically coupled to the semiconductor passivation layer such that electric charge can flow into the second terminal from the semiconductor passivation layer
wherein:
the passivation layer is configured and arranged to transfer leakage current from the first terminal to the second terminal;
the leakage current is greater than $$\frac{q n_{inj} L_{drift} W_{finger}}{\tau};$$

$\tau$ is the time constant for the build-up of charges injected into the semiconductor passivation layer from the second layer;
q is the electron charge;
$n_{inj}$ is the number density of electrons in the Two-Dimensional Electron Gas;
$L_{drift}$ is the physical distance between the first terminal and second terminal; and
$W_{finger}$ is the width of the first terminal in a first direction.

18. The heterojunction semiconductor device of claim 17, wherein:
the heterojunction semiconductor device is a transistor having a source electrode, a drain electrode and a gate electrode;
the gate electrode comprises the first terminal; and
the drain electrode comprises the second terminal.

* * * * *